United States Patent
Iyer et al.

(10) Patent No.: US 10,573,354 B2
(45) Date of Patent: Feb. 25, 2020

(54) HIGH DENSITY MEMORY MODULE SYSTEM

(71) Applicant: SMART Modular Technologies, Inc., Newark, CA (US)

(72) Inventors: Satyanarayan Shivkumar Iyer, Fremont, CA (US); Robert S. Pauley, Jr., Mission Viejo, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 128 days.

(21) Appl. No.: 15/273,385

(22) Filed: Sep. 22, 2016

(65) Prior Publication Data

US 2018/0081554 A1  Mar. 22, 2018

(51) Int. Cl.
| | |
|---|---|
| *G06F 12/00* | (2006.01) |
| *G11C 7/00* | (2006.01) |
| *G06F 13/00* | (2006.01) |
| *G06F 13/28* | (2006.01) |
| *G06F 3/06* | (2006.01) |

(52) U.S. Cl.
CPC .............. *G11C 7/00* (2013.01); *G06F 3/0607* (2013.01); *G06F 3/0647* (2013.01); *G06F 3/0655* (2013.01); *G06F 3/0685* (2013.01)

(58) Field of Classification Search
CPC .... G06F 3/0607; G06F 3/0647; G06F 3/0685; G06F 3/0655
See application file for complete search history.

(56) References Cited

U.S. PATENT DOCUMENTS

| | | | | |
|---|---|---|---|---|
| 5,519,831 A | * | 5/1996 | Holzhammer | G06F 11/1441 365/228 |
| 5,963,464 A | | 10/1999 | Dell et al. | |
| 6,109,929 A | * | 8/2000 | Jasper | G06F 1/184 361/790 |
| 6,324,071 B2 | * | 11/2001 | Weber | H05K 1/144 228/180.21 |
| 6,336,174 B1 | * | 1/2002 | Li | G06F 11/1441 365/228 |
| 8,277,229 B2 | * | 10/2012 | Chiu | H01R 12/737 361/785 |
| 9,298,228 B1 | * | 3/2016 | Abhyankar | G06F 1/185 |
| 9,496,633 B1 | * | 11/2016 | Huang | G06F 1/185 |
| 2002/0048157 A1 | | 4/2002 | Lee | |
| 2002/0142660 A1 | * | 10/2002 | Abe | H01R 12/7082 439/631 |
| 2004/0010649 A1 | * | 1/2004 | Weaver | H02J 9/00 710/302 |

(Continued)

OTHER PUBLICATIONS

World Intellectual Property Organization, Application No. PCT/US17/51669, International Search Report dated Jan. 11, 2018.

(Continued)

*Primary Examiner* — Mark A Giardino, Jr.
(74) *Attorney, Agent, or Firm* — Wong & Rees LLP

(57) ABSTRACT

Approaches, techniques, and mechanisms are disclosed for manufacturing and operating high density memory systems. The high density memory systems can increase the amount of memory available to a computing system by allowing the connection of multiple memory modules into a single memory interface on a motherboard via a memory adapter as described herein.

20 Claims, 7 Drawing Sheets

(56) References Cited

U.S. PATENT DOCUMENTS

| | | | |
|---|---|---|---|
| 2004/0230718 A1* | 11/2004 | Polzin | G06F 12/0215 |
| | | | 710/22 |
| 2009/0293052 A1* | 11/2009 | Kim | G06F 9/4411 |
| | | | 717/174 |
| 2010/0067278 A1 | 3/2010 | Oh et al. | |
| 2011/0149499 A1* | 6/2011 | Bandholz | G06F 1/185 |
| | | | 361/679.31 |
| 2011/0153908 A1* | 6/2011 | Schaefer | G06F 12/0607 |
| | | | 711/5 |
| 2013/0107443 A1 | 5/2013 | Kim et al. | |
| 2013/0330966 A1* | 12/2013 | Perez-Uria | H05K 3/368 |
| | | | 439/569 |
| 2015/0332736 A1 | 11/2015 | Bringivijayaraghavan et al. | |
| 2016/0066468 A1* | 3/2016 | Smith | H05K 7/208 |
| | | | 361/679.52 |

OTHER PUBLICATIONS

World Intellectual Property Organization, Application No. PCT/US17/51669, Pending Claims as of Jan. 11, 2018.

\* cited by examiner

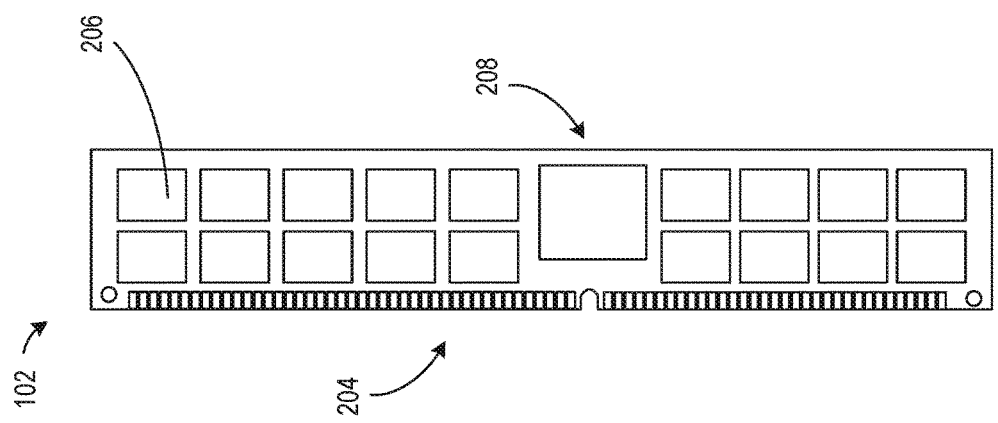
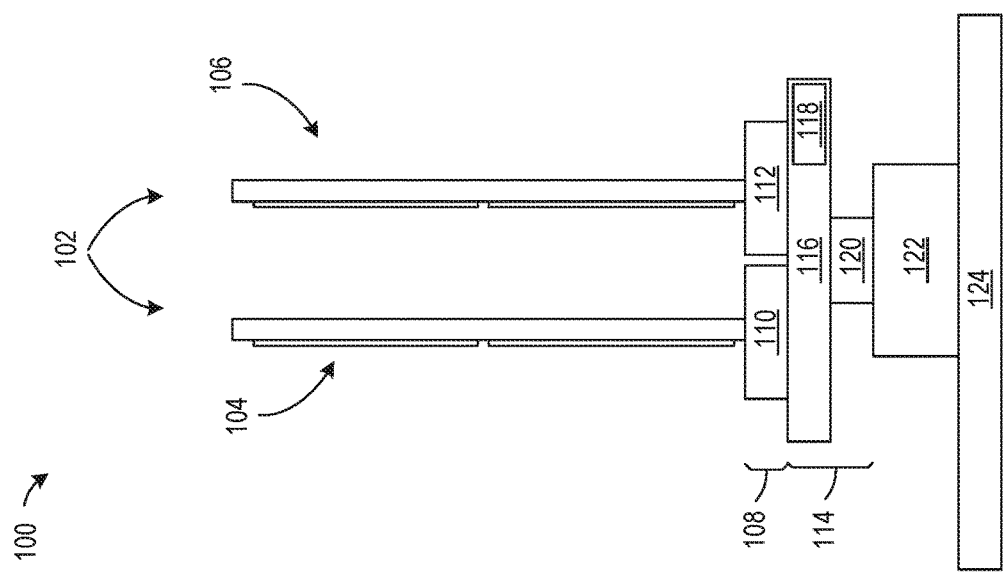

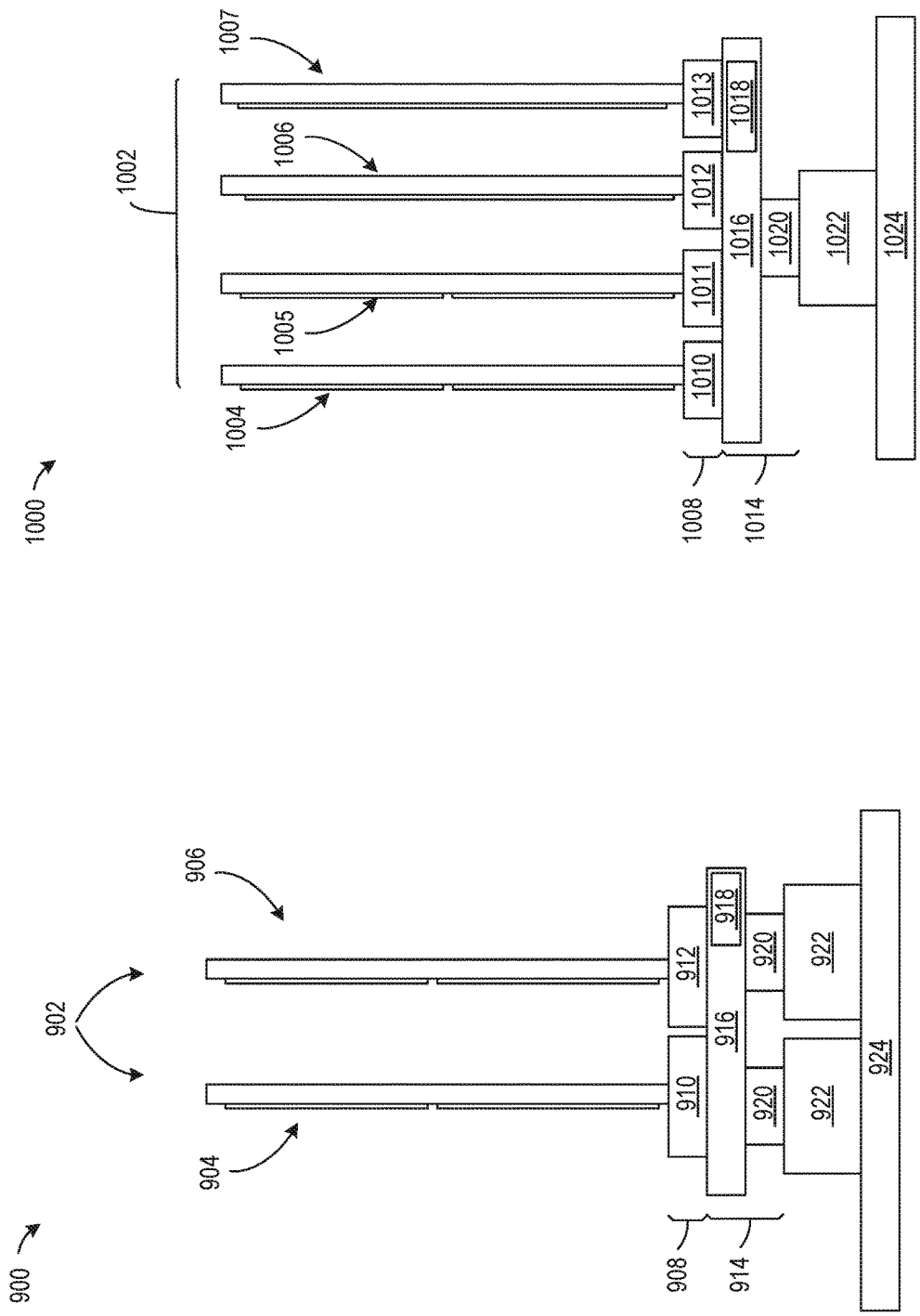

HIGH DENSITY MEMORY MODULE SYSTEM

TECHNICAL FIELD

Embodiments relate generally to computer memory and, more specifically, to systems for increasing memory density used in electronic systems.

BACKGROUND

Consumer and industrial electronic systems and devices are increasing in complexity and computation power, and often require additional system resources to keep up with modern, high-powered computer applications. New applications often deal with large amounts of data, thus requiring additional computing power to perform computations in reasonable amounts of time.

Computer system processors and support systems are evolving to provide more computation throughput in smaller packages. Further, many computer systems include parallel architectures and processors to increase the amount of computation power available in a system.

Individual computer memory chips are being developed with higher density and high transistor counts for the induvial devices. Standardization with the industry results in the creation of standardized memory products having quantized sizes and capacities.

Modern computer systems use the standardized components available memory storage and computational workspace use. Increasing compute power or memory size is often achieved by utilizing higher power computer chips and large capacity memory chips.

BRIEF DESCRIPTION OF THE DRAWINGS

The inventive subject matter is illustrated by way of example, and not by way of limitation, in the figures of the accompanying drawings and in which like reference numerals refer to similar elements and in which:

FIG. 1 illustrates an example memory module system;

FIG. 2 shows an example of a memory module;

FIG. 9 shows an example of a double module system;

FIG. 10 shows an example of a multiple module system;

DETAILED DESCRIPTION

Figure 4:
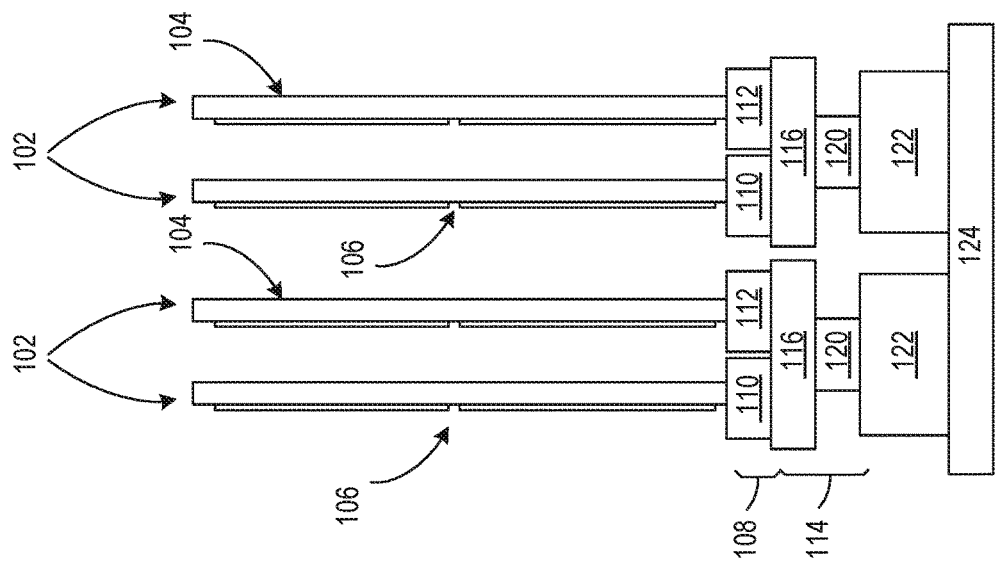
FIG. 4 shows an example of the memory module system in adjacent memory channel connector.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present inventive subject matter.

Embodiments are described herein according to the following outline:
 1.0. General Overview
 2.0. Structural Overview
 2.1. Memory Module System
 2.2. Memory Module
 2.3. Angled Module System
 2.4. Adjacent Memory Module System
 2.5. Horizontal Module System
 2.6. Horizontal Memory Module
 2.7. Adjacent Horizontal Memory Module System
 2.8. Extended Module System
 2.9. Double Module System
 2.10. Multiple Module System
 2.11. Miscellaneous
 3.0. Implementation Mechanism—Hardware Overview
 4.0. Functional Overview
 4.1. Manufacturing Flow
 4.2. Operation Flow
 5.0. Example Embodiments
 6.0. Extensions and Alternatives

1.0. General Overview

Approaches, techniques, and mechanisms are disclosed for manufacturing and operating high density memory systems. According to an embodiment, the high density memory systems increase the amount of memory available to a computing system by, among other aspects, allowing the connection of multiple memory modules into a single memory interface on a motherboard via a memory adapter as described herein.

In an embodiment, a high density memory system may be configured with a variety of types of memory modules, and connect them to a single memory connector slot. The memory modules may be implemented in a variety of physical form factors. For example, the memory modules may be connected to the memory modules in a vertical configuration, in a horizontal configuration, in an angled configuration, or a combination thereof.

In an embodiment, the memory modules may include simplified memory modules with less logic and control circuitry on the module. By configuring the module adapter with a memory controller, the memory module may accommodate memory modules that do not have their own memory controller.

In an embodiment, the high density memory module system increases the amount of memory available to a computer system by increasing the number of memory modules that can be connected to a single memory interface connector. Further, in a configuration where the memory module system includes an on-board memory controller, simplified memory modules without their own memory controllers may be utilized.

2.0. Structural Overview

2.1. Memory Module System

FIG. 1 illustrates a view of various aspects of a memory module system 100 in which the techniques described herein may be practiced, according to an embodiment. The memory module system 100 integrates multiple memory modules 102 on a module adapter 114 installed in a memory channel connector 122 on a motherboard 124. The memory module system 100 may provide larger amounts of memory than supported by a single memory module and support hybrid memory configurations.

The memory module system 100 can comprise one or more memory modules 102, such as a first memory module 104 or a second memory module 106, installed in module connectors 108 attached to the module adapter 114 which is attached to a computer system. The memory system 100 can be installed into the memory channel connector 122 of the motherboard 124 and appear to the computer system to be a single, higher capacity memory module.

The memory modules 102, such as a first memory module 106 or a second memory module 106, can be any type of memory related module. For example, the memory modules 102 may be volatile memory modules, non-volatile memory modules, DRAM modules, Flash modules, power modules, control modules, or a combination thereof.

Volatile memory modules are modules having random access memory (RAM) that is not preserved in case of power failure. Volatile memory modules may include, for example, Dual In-Line Memory Modules (DIMM), Single In-Line Memory Modules (SIMM), or other similar memory devices.

The non-volatile memory modules are persistent memory devices having memory devices that preserve the contents of the memory devices in case of power failure. Non-volatile memory modules may include, for example, Flash memory, ferroelectric random access memory (F-RAM), magnetoresistive random access memory (M-RAM), or other similar persistent memory devices.

Power modules are boards having an on-board power unit configured to supply power to other system components. The power modules may further comprise logic that implements various processes and interfaces configured to provide functionality that can include, for example, other memory and control functionality, in addition to the power functionality provided by the power unit.

Control modules are devices having control logic to control memory devices or interact with other systems. Through this control logic, the control modules may implement various processes and interfaces configured to provide control functionality that can include, for example, other memory or power functionality.

The module connectors 108, such as a first connector 110 or a second connector 112, are structures to connect a memory module to another system. The connectors may be DIMM sockets connectors, SIMM socket connectors, or other types of socketed memory connectors. Although the connectors are shown as mechanisms, the memory modules may in fact be attached in other ways, such as by soldering. The connectors may have a variety of configurations, depending on the type of memory module used.

The module adapter 114 is a structure for coupling one or more of the memory modules 102 to the motherboard 124. The module adapter 114 can include an adapter board 116 having an adapter control unit 118 and an adapter connector 120. For example, the module adapter 114 may be configured as a printed circuit board (PCB) having the module connectors 108 on one side and an adapter connector 120 on the opposite side.

The adapter board 116 is an electrical element for supporting and connecting other electronic elements. The adapter board 116 can include electrical redistribution traces for conducting electrical signals to the electrical elements on the board. The electrical redistribution traces can transfer signals and power around the board including from a top side to a bottom side of the circuit board. The module connectors 108 are attached to the adapter board 116 of the module adapter 114 to allow the memory modules 102 to be mounted on the module adapter 114. For example, the adapter board 116 can be a transposer board with gold finger pins to connect to the memory channel connector 120 of the motherboard 124.

The adapter connector 120 is an electrical element for connecting the adapter board 116 to the memory channel connector 122. The adapter connector 120 can be a part of the adapter board 116 or directly attached to the adapter board 116.

The adapter connector 120 can have a variety of configurations. For example, the adapter connector 120 can be matched for the same configuration as the module connectors 108. An another example, the adapter connector 120 can be matched for any other type of the memory channel connector 122 on the motherboard 124. Matching can be defined as having the same electrical and mechanical properties. Matching can include having the same pin configuration, the same electrical requirements, the same timing parameters, or other similar parameters.

Matching means that the adapter connector 120 is configured to be connected to the memory channel connector 120. For example, the adapter connector 120 may be configured as the male portion to be inserted into the female receptacle of the memory channel connector 122.

The module adapter 114 can include the adapter control unit 118 to provide the additional logic and electrical components to support the memory modules 102. For example, the adapter control unit 118 can include the control logic to manage the module rank addressing for the memory modules 102. In another example, the adapter control unit 118 can include the control logic to backup a dynamic random access memory module to a Flash memory module when a power failure is detected. In yet another example, the adapter control unit 118 can include power management control logic to control the power to the memory modules 102 in the event of a loss of power.

The adapter control unit 118 can configure the module adapter 114 to be electrically isolated from the memory channel connector 122. The memory module system 100 can then operate in isolation from any external system. For example, the adapter control unit 118 can detect a loss of power indicator from the external system and electrically isolate the module adapter 114 from the memory channel connector 122. The adapter control unit 118 can then perform a backup from a volatile memory module to a non-volatile memory module utilizing a power module to provide operating power during the backup.

In some embodiments, the memory modules 102 may include additional control logic to supplement or replace the control logic of the module adapter 114. For example, one of the memory modules 102 can include the control logic to perform address translation, backup operations, and other related actions. For example, the control logic as described above may be on one of the memory modules 102. This may allow, for instance, one of the memory modules 102 to control the functionality of the other modules attached to the module adapter 114. In yet another example, the adapter control unit 118 and the associated control logic may be completely on one of the memory modules 102, and the module adapter 114 can act as a passive device providing connectivity for the memory modules 102. The control logic of the adapter control unit 118 on one of the memory modules 102 can control the operation of the other memory modules connected to the module adapter 114.

The module adapter 114 is shown in a particular form factor, although it is understood that the module adapter 114 can have a variety of form factors. For example, the module adapter 114 can be oriented horizontally or vertically. The module adapter 114 can be constructed from a variety of materials including resin, plastic, polyimide, fiberglass, ceramic, composites, or a combination thereof.

The module adapter 114 can have a variety of electrical component configurations. For example, the module adapter 114 can be attached to more than two of the memory modules 102. The module adapter 114 may include a printed circuit board, flexible circuit boards, film support structures, electrical traces, metal traces, conductive traces, discrete components, integrated circuits, or a combination thereof.

In an embodiment, the memory module system 100 can increase the amount of memory available to a computer system by allowing multiple memory modules to be connected to the memory channel connector 122 of the motherboard 124. The amount of memory available on the memory module system 100 can exceed the amount of memory available on individual memory modules and thus allow more memory without altering the physical configuration of the motherboard 124.

In an embodiment, the memory module system 100 can increase system performance by, among other aspects, separating the heat profile of the memory module system 100 from the motherboard 124. The additional physical distance provided by the module adapter 114 can reduce the thermal impact on the motherboard 124.

In an embodiment, the memory module system 100 can add additional flexibility of the computer's memory subsystem by, among other aspects, providing hybrid functionality in a memory package. The memory modules 102 of the memory module system 100 can be different from one another to provide varying functionality.

For example, the memory module system 100 can combine different configurations of the memory modules 102. The memory modules 102 can combine different module sizes, technologies, speeds, capacities, and functions. The memory modules 102 may have different pin configurations and still provide a single interface to the host computer. The memory modules 102 may be different types of memory, such as dynamic random access memory and Flash memory in a single unit.

In an embodiment, a module connector 108 may be used to connect to different types of modules other than just the memory modules 102. For example, the module connectors 108 can be used to mount backup power boards, cooling elements, non-volatile memory units, or other similar types of devices. The module adapter 114 can include an onboard power source to provide failure resistance to power interruptions.

2.2. Memory Module

Referring now to FIG. 2, therein is shown an example of one of the memory modules 102. The memory modules 102, such as the first memory module 104 of FIG. 1 or the second memory module 106 of FIG. 1, are mounted to the module adapter 114 of FIG. 1 using, for example, the module connectors 108 of FIG. 1.

The memory modules 102 may include a pin connector 204 having multiple pins for connecting the memory module to the module connectors 108 of the memory module system 100 of FIG. 1. The memory module 102 include memory chips 206 for storing information.

A memory module 102 can optionally include a memory controller 208 for controlling the memory chips 206 and interfacing with the host system via the pin connector 204.

In some configurations, the memory module 102 can be fabricated without the memory controller 208 if the module adapter 114 includes the memory controller 208 within the adapter control unit 118 of FIG. 1.

Although the memory modules 102 are shown as dual in-line memory modules (DIMM), it is understood that the memory modules 102 may have a variety of configurations. For example, the memory modules 102 may be single in-line memory modules (SIMM), double in-line memory modules (DIMM), small outline dual in-line memory modules (SO-DIMM), micro-DIMMs, mini-DIMMs, simplified memory modules, or other formats.

The memory modules 102 can use any of a variety of memory technologies including, without limitation, static random-access memory (SRAM), dynamic random-access memory (DRAM), synchronous dynamic random access memory (SDRAM), Flash memory, resistive memory, change coupled devices, single data rate random access memory, double data rate synchronous dynamic random access memory (DDR SDRAM), synchronous dynamic random access memory, or other volatile or non-volatile memory device types.

Although the module adapter is shown with the memory modules 102 installed in the module connectors 108, it is understood that in certain embodiments other types of modules can be installed in the module connectors 108. For example, a module installed in the module connectors 108 can be a memory module, a thermal control module, a backup module, a power module, volatile memory module, non-volatile memory module, or a similar type of module having memory related functionality.

2.3. Angled Module System

Figure 3:
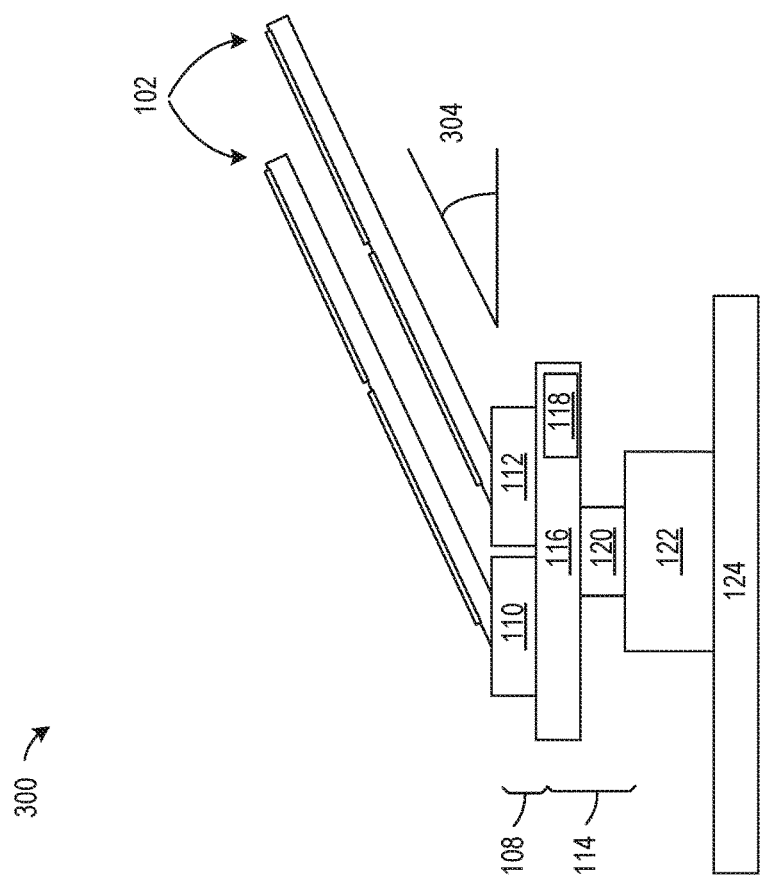
FIG. 3 shows an example of an angled module system.

Referring now to FIG. 3, therein is shown an example of an angled module system 300 in an embodiment. The angled module system 300 can attach the memory modules 102 using the module connectors 108, such as the first connector 110 or the second connector 112, that can mount the memory modules 102 at a mounting angle 304. The angled module system 300 is an embodiment of the memory module system.

The angled module system 300 may mount the memory modules 102 in the module connectors 108 at the mounting angle 304 to reduce the vertical height of the angled module system 300 and form a flatter package. Mounting the memory modules 102 at the mounting angle 304 can reduce the physical dimensions of the system and also reduce the size requirements of the host system. The module adapter 114 can include the module board 116, the adapter control unit 118, and the adapter connector 120. The adapter connector 120 may be mounted in the memory channel connector 122 on the motherboard 124.

The mounting angle 304 can range from between 10 degrees and 45 degrees. For example, in an embodiment, the mounting angle 304 is approximately 22 degrees.

2.4. Adjacent Memory Module System

Referring now to FIG. 4, therein is shown an example of the memory module system 100 of FIG. 1 in adjacent memory channel connector 122. The memory module system 100 can be used to replace the memory modules 102 that could be installed directly in the memory channel connector 122.

The memory modules 102, such as the first memory module 104 or the second memory module 106, can be mounted in the module connectors 108, such as the first connector 110 or the second connector 112, on the module adapter 114. The module adapter 114 can include the module board 116, the adapter control unit 118, and the adapter connector 120. The adapter connector 120 may be mounted in the memory channel connector 122 on the motherboard 124.

In an embodiment, installing the memory module system 100 in adjacent memory channel connector 122 provides a physical layout and configuration of the memory subsystem supportive of additional cooling and heat dissipation. By positioning the memory modules 102 further apart from one another, the thermal characteristics of the memory subsystem may in certain embodiments be improved and more heat can be dissipated over a greater area.

2.5. Horizontal Module System

Figure 5:
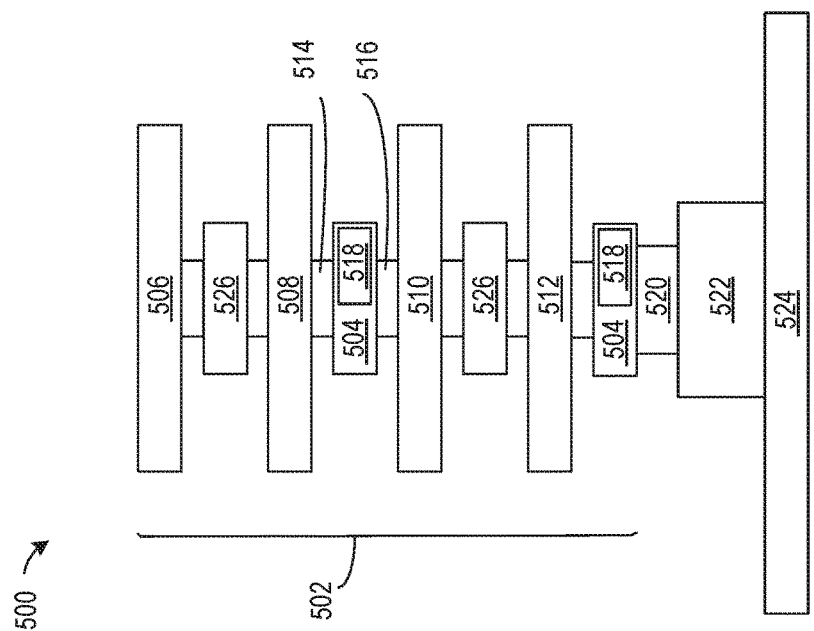
FIG. 5 shows an example of a horizontal module system.

Referring now to FIG. 5, therein is shown an example of a horizontal module system 500 in an embodiment. The horizontal module system 500 can mount the memory modules 502 onto serial adapters 504 in a flat configuration, with the memory modules 502 parallel to the motherboard 524. The horizontal module system 500 is an embodiment of a memory module system in accordance with the described techniques.

The horizontal module system 500 can connect a number of the memory modules 502 to the memory channel connector 522 of the motherboard 524 via the adapter connector 520. Each of the memory modules 502, such as a first horizontal module 506, a second horizontal module 508, a third horizontal module 510, and a fourth horizontal module 512 may be connected to one another with the serial adapters 504. Although the horizontal module system 500 is shown with four of the memory modules 502, it is understood that any number of the memory modules 502 can be supported in different configurations.

The serial adapters 504 are electronic components having an upper connector 514 and a lower connector 516. The upper connector 514 connects the serial adapters 504 to the module above. The lower connector 514 connects the serial adapters 504 to the memory module 502 below them. The upper connector 514 and the lower connector 516 allow the serial adapters 504 to connect to one another and to the adapter connector 520.

Each of the serial adapters 504 includes an adapter control unit 518. The adapter control unit 518 includes the control logic to manage the transfer of data to and from the memory modules 502. In some configurations, the serial adapters 504 can be directly connected to the memory modules 502 without the use of the upper connector 514 or the lower connector 516.

In an alternative example, the adapter control unit 518 and the related control logic can be on one of the memory modules 502. This allows one of the memory modules 502 to control the other memory modules attached to the serial adapters 504. In this case, the serial adapter 504 can act as a passive device providing connectivity to the memory modules 502 attached to the serial adapters 504. The control logic of the adapter control unit 518 on one of the memory modules 502 can control the operation of the other memory modules connected to the serial adapter 504.

The adapter control unit 518 can configure the serial adapter 504 to be electrically isolated from the memory channel connector 522. The memory module system 500 can then operate in isolation from any external system. For example, the adapter control unit 118 can detect a loss of power indicator from the external system and electrically isolate the serial adapter 504 from the memory channel connector 522. The adapter control unit 118 can then perform a backup from a volatile memory module to a non-volatile memory module utilizing a power module to provide operating power during the backup.

In some configurations, some but not all of the serial adapters 504 can be replaced with a pass-through adapter 526. In these configurations, at least one of the serial adapters 504 having the adapter control unit 518 is part of the memory module system 500. The pass-through adapter 526 is a passive component that can support the transfer of data from one serial adapter to another via the upper connector 514 and the lower connector 516. In another example, the adapter control unit 518 can be on one of the memory modules 102.

The lowest one of the serial adapters 504 may be connected to the memory channel connector 522 with an adapter connector 520. The adapter connector 520 allows the memory module system 500 to be installed in the memory channel connector 522 of the motherboard 524.

The serial adapter 504 is shown in a particular form factor, although it is understood that the serial adapter 504 can have a variety of form factors. For example, the serial adapter 504 can be oriented horizontally or vertically. The serial adapter 504 can be constructed from a variety of materials, including resin, plastic, polyimide, fiberglass, ceramic, composites, or a combination thereof.

The serial adapter 504 can have a variety of electrical component configurations. For example, the serial adapter 504 can be attached to more than two of the memory modules 502. The serial adapter 504 can include, for example, a printed circuit board, flexible circuit boards, film support structures, electrical traces, metal traces, conductive traces, discrete components, integrated circuits, or a combination thereof.

In an embodiment, the horizontal module system 500 can increase the amount of memory available to a computer system by, among other aspects, allowing multiple memory modules to be connected to the memory channel connector 522 of the motherboard 524. The amount of memory available on the horizontal module system 500 may exceed the amount of memory available on individual memory modules, and thus allow more memory without altering the physical configuration of the motherboard 524.

In an embodiment, the horizontal module system 500 can increase system performance by, among other aspects, separating the heat profile of the horizontal module system 500 from the motherboard 524. The additional physical distance provided by the serial adapter 504 can reduce the thermal impact on the motherboard 524.

In an embodiment, the horizontal module system 500 can add additional flexibility of the computer's memory subsystem by, among other aspects, providing hybrid functionality in a memory package. The memory modules 502 of the horizontal module system 500 can be different from one another to provide varying functionality.

For example, the horizontal module system 500 may combine different configurations of the memory modules 502. The memory modules 502 may combine different module sizes, technologies, speeds, capacities, and functions. The memory modules 502 can include different pin configurations and still provide a single interface to the host computer. The memory modules 502 may include different types of memory, such as dynamic random access memory and Flash memory in a single unit.

2.6. Horizontal Memory Module

Figure 6:
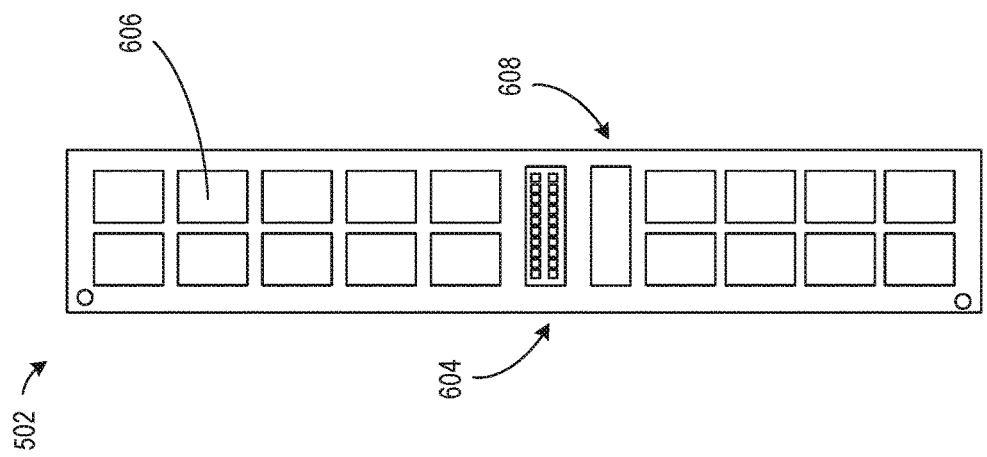
FIG. 6 shows an example of one of the memory modules for the horizontal module system.

Referring now to FIG. 6, therein is shown an example of one of the memory modules 502 for the horizontal memory system 500 of FIG. 5. The memory modules 502, such as the first horizontal module 506 of FIG. 5, the second horizontal module 508 of FIG. 5, the third horizontal module 510 of FIG. 5, or the fourth horizontal module 512 of FIG. 5, can be connected to the serial adapters 504.

The memory modules 502 can have a stacking connector 604, such as the upper connector 514 of FIG. 5 or the lower connector 516 of FIG. 5. For example, the stacking connector 604 can be located in the middle of the memory modules 502.

The memory modules 502 can be connected to the serial adapters 504 of FIG. 5 by attaching the stacking connector 604 to the serial adapter 504. The stacking connector 604 can have a variety of configurations. For example, the stacking connector 04 can be a male or female connector and have multiple pins or receptacles, respectively, for connected the memory module to the module connectors 508 of the horizontal module system 500. The memory module can include memory chips 606 for storing information.

The memory modules 502 can include a memory controller 608 for controlling the memory chips 606 and interfacing with the host system via the stacking connector 604. In some configurations, the memory modules 502 can be fabricated without the memory controller 608, and the serial adapters 504 can includes the memory controller 608 within the adapter control unit 518 of FIG. 5.

The memory modules 502 may use a variety of memory technologies, depending on the embodiment. The memory modules 502 can be static random-access memory (SRAM), dynamic random-access memory (DRAM), synchronous dynamic random access memory (SDRAM), Flash memory, resistive memory, change coupled devices, single data rate random access memory, double data rate synchronous dynamic random access memory (DDR SDRAM), synchronous dynamic random access memory, or other volatile or non-volatile memory device types.

Although the horizontal module system 500 is shown with the memory modules 502 connected to the serial adapters 504, it is understood that other types of modules can be installed in the module connectors 508. Examples of modules that may be connected to the serial adapter 504 include, without limitation, a memory module, a thermal control module, a backup module, a power module, volatile memory module, non-volatile memory module, or a similar type of module having memory related functionality.

2.7. Adjacent Horizontal Memory Module System

Figure 7:
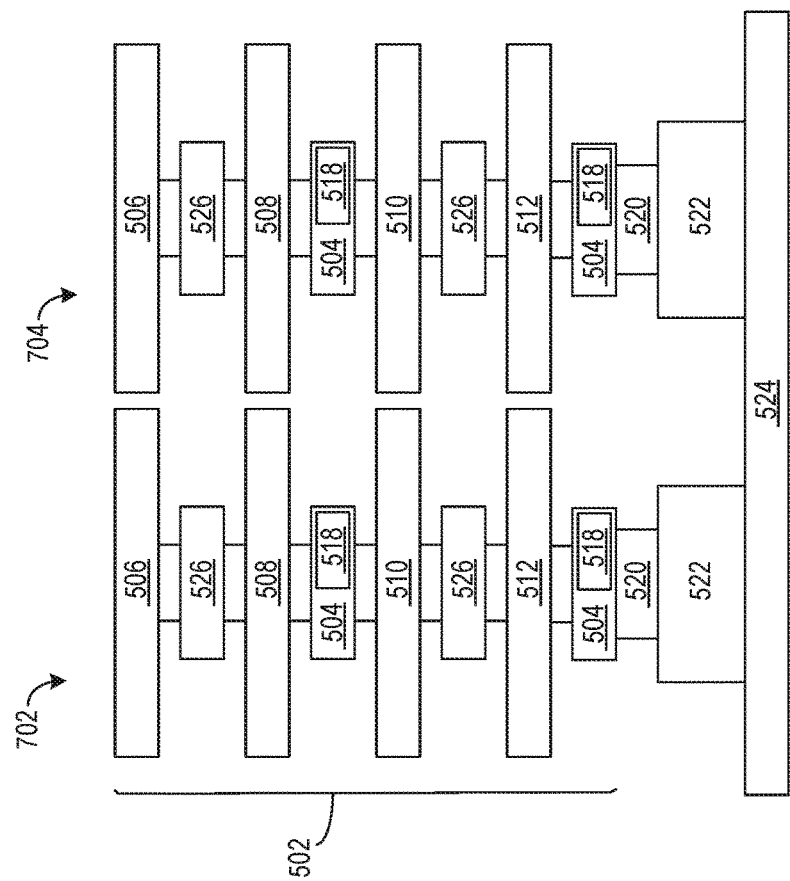
FIG. 7 shows an example of two of the horizontal module systems in adjacent memory channel connector.

Referring now to FIG. 7, therein is shown an example of two of the horizontal module systems in adjacent memory channel connector 522. The memory module system 702 and the memory module system 704 are used to replace the memory modules 102 of FIG. 1 that could be installed directly in the memory channel connector 522.

The memory modules 502, such as the first horizontal module 506, the second horizontal module 508, the third horizontal module 510, or the fourth horizontal module 512, can be connected to the serial adapters 504 having the adapter control unit 518. Alternatively, the memory modules 502 can be connected to the pass-through adapter 526. The module adapter 504 can include the adapter connector 520 which can be mounted in the memory channel connector 522 on the motherboard 524.

In an embodiment, installing the memory module system 702 and the memory module system 704 in adjacent memory channel connector 522, such as a first memory channel connector or a second memory channel connector, provides a physical layout and configuration of the memory subsystem supportive of additional cooling and heat dissipation. By positioning the memory modules 502 further apart from one another, among other advantages, the thermal characteristics of the memory subsystem is improved and more heat can be dissipated over a greater area.

2.8. Extended Module System

Figure 8:
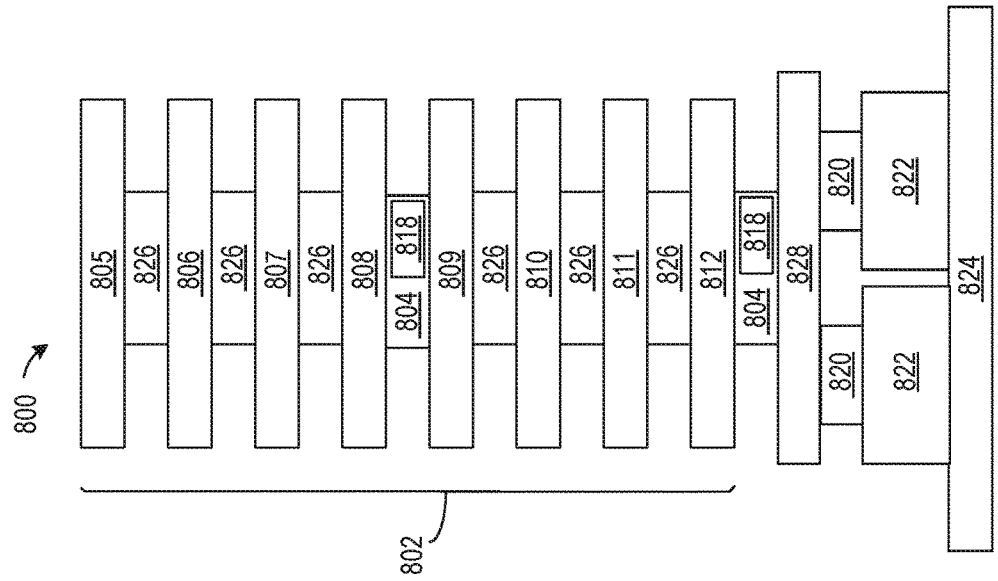
FIG. 8 shows an example of an extended module system.

Referring now to FIG. 8, therein is shown an example of an extended module system 800 in an embodiment. The extended module system 800 can mount the memory modules 802 onto serial adapters 804 in a flat configuration with the memory modules 802 parallel to the motherboard 824. The extended module system 800 is an embodiment of a memory module system in accordance with the described techniques.

The extended module system 800 connects a number of the memory modules 802 to the memory channel connector 822 of the motherboard 824 via the adapter connector 820. Each of the memory modules 802, such as a first extended module 805, a second extended module 806, a third extended module 807, a fourth extended module 808, a fifth extended module 809, a sixth extended module 810, a seventh extended module 811, and an eighth extended module 812 can be connected to one another with the serial adapters 804. Although the extended module system 800 is shown with eight memory modules 802, it is understood that any number of the memory modules 802 can be supported in different configurations.

The serial adapters 804 are electronic components for connecting to the memory modules 802. The serial adapter 804 allows the transfer of data and power between the memory modules 802 and the motherboard 824 via the memory channel connector 822.

Each of the serial adapters 804 can include an adapter control unit 818. The adapter control unit 818 includes the control logic to manage the transfer of data to and from the memory modules 802. In some configurations, the serial adapters 804 can be directly connected to the memory modules 802 with connectors between them.

In an alternative example, the adapter control unit 818 and the related control logic can be on one of the memory modules 802. This allows one of the memory modules 802 to control the other memory modules attached to the serial adapters 804. In this case, the serial adapter 804 can act as a passive device providing connectivity to the memory modules 802 attached to the serial adapters 804. The control logic of the adapter control unit 818 on one of the memory modules 802 can control the operation of the other memory modules connected to the serial adapter 804.

The adapter control unit 818 can configure the serial adapter 804 and the adapter board 828 to be electrically isolated from the memory channel connector 822. The memory module system 800 can then operate in isolation from any external system. For example, the adapter control unit 818 can detect a loss of power indicator from the external system and electrically isolate the serial adapter 504 and the adapter board 828 from the memory channel connector 522. The adapter control unit 818 can then perform a backup from a volatile memory module to a non-volatile memory module utilizing a power module to provide operating power during the backup.

In some configurations, some but not all of the serial adapters 804 can be replaced with a pass-through adapter 826. In these configurations, at least one of the serial adapters 804 having the adapter control unit 818 must be part of the memory module system 800. The pass-through adapter 826 can be a passive component that supports the transfer of data from one serial adapter to another. In another example, the adapter control unit 818 can be on one of the memory modules 802.

The memory modules 802 may be coupled to the mother board with an adapter connector 820. The adapter connector 820 can connect to the memory channel connector 822. In some configurations, a serial adapter 804 can be connected to an adapter board 828 that is connected to the adapter connector 820. The adapter board 828 can be a passive device to facilitate the connectivity between the serial adapter 804 and two adapter connectors 820. An adapter connector 820 allows the memory module system 800 to be installed in the memory channel connector 822 of the motherboard 824. The two adapter connectors 820 may be connected to two of the memory channel connector 822 to act as two memory modules.

2.9. Double Module System

Referring now to FIG. 9, therein is shown an example of a double module system 900 in an embodiment. The double module system 900 can integrate two or more of the memory modules 902 on a module adapter 914 installed in a memory channel connector 922 on a motherboard 924. In an embodiment, the double module system 900 can provide larger amounts of memory than supported by a single memory module and support hybrid memory configurations. The double module system 900 is an embodiment of the memory module system in accordance with the described techniques.

The double module system 900 can comprise one or more memory modules 902 installed in module connectors 908 attached to the module adapter 914 which is attached to a computer system. The module adapter 914 can be connected to two of the memory channel connector 922 on the motherboard 924. The double module system 900 can be installed into the memory channel connector 922 of the motherboard 924 and appear to the computer system to be two memory modules, each in a different one of the memory channel connector 922.

The memory modules 902, such as a first memory module 904 or a second memory module 906, may be any type of memory related module. For example, the memory modules 902 may include volatile memory modules, non-volatile memory modules, DRAM modules, Flash modules, power modules, control modules, or a combination thereof, as described elsewhere in the disclosure.

The module connectors 908, such as a first connector 910 or a second connector 912, are structures to connect a memory module to another system. The connectors can be DIMM socket connectors, SIMM socket connectors, or other types of socketed memory connectors. Although the connectors are shown as attachment mechanisms, it is understood that the memory modules can be attached in other ways, such as by soldering. The connectors can have a variety of configurations depending on the type of memory module used.

The module adapter 914 is a structure for coupling one or more of the memory modules 902 to the motherboard 924. The module adapter 914 can include an adapter board 916 having an adapter control unit 918 and an adapter connector 920. For example, the module adapter 914 may be configured as a printed circuit board (PCB) having the module connectors 908 on one side and an adapter connector 920 on the opposite side.

The adapter board 916 is an electrical element for supporting and connecting other electronic elements. The adapter board 916 can include electrical redistribution traces for conducting electrical signals to the electrical elements on the board. The electrical redistribution traces can transfer signals and power around the board including from a top side to a bottom side of the circuit board. The module connectors 908 may be attached to the adapter board 916 of the module adapter 914 to allow the memory modules 902 to be mounted on the module adapter 914. For example, the adapter board 916 can be a transposer board with gold finger pins to connect to the memory channel connector 920 of the motherboard 924.

The adapter connector 920 is an electrical element for connecting the adapter board 916 to the memory channel connector 922. The adapter connector 920 can be a part of the adapter board 916 or directly attached to the adapter board 916.

The adapter connector 920 can have a variety of configurations. For example, the adapter connector 920 can be matched for the same configuration as the module connectors 908. An another example, the adapter connector 920 can be matched for any other type of the memory channel connector 922 on the motherboard 924.

Matching means that the adapter connector 920 is configured to be connected to the memory channel connector 920. For example, the adapter connector 920 can be configured as the male portion to be inserted into the female receptacle of the memory channel connector 922.

The module adapter 914 can include the adapter control unit 918 to provide the additional logic and electrical components to support the memory modules 902. For example, the adapter control unit 918 includes the control logic to manage the module rank addressing for the memory modules 902. In another example, the adapter control unit 918 may include the control logic to backup up a dynamic random access memory module to a Flash memory module when a power failure is detected. In yet another example, the adapter control unit 918 can include power management control logic to control the power to the memory modules 902 in the event of a loss of power.

The adapter control unit 918 can configure the module adapter 914 to be electrically isolated from the memory channel connector 922. The memory module system 900 can then operate in isolation from any external system. For example, the adapter control unit 918 can detect a loss of power indicator from the external system and electrically isolate the module adapter 914 from the memory channel connector 922. The adapter control unit 918 can then perform a backup from a volatile memory module to a non-volatile memory module utilizing a power module to provide operating power during the backup.

In still another example, the control logic can be on one of the memory modules 902. This may allow, for example, one of the memory modules 902 to control the functionality of the other modules attached to the module adapter 914. In yet another example, the adapter control unit 918 and the associated control logic may be completely on one of the memory modules 902, and the module adapter 914 can be a passive device providing connectivity for the memory modules 902. The control logic of the adapter control unit 918 on one of the memory modules 902 can control the operation of the other memory modules connected to the module adapter 914.

The module adapter 914 is shown in a particular form factor, although it is understood that the module adapter 914 can have a variety of form factors. For example, the module adapter 914 can be oriented horizontally or vertically. The module adapter 914 can be constructed from a variety of materials including resin, plastic, polyimide, fiberglass, ceramic, composites, or a combination thereof.

The module adapter 914 can have a variety of electrical component configurations. For example, the module adapter 914 may be attached to more than two of the memory modules 902. The module adapter 914 may include a printed circuit board, flexible circuit boards, film support structures, electrical traces, metal traces, conductive traces, discrete components, integrated circuits, or a combination thereof.

The double module system 900 can increase the amount of memory available to a computer system by allowing multiple memory modules to be connected to the memory channel connector 922 of the motherboard 924. The amount of memory available on the double module system 900 can exceed the amount of memory available on individual memory modules and thus allow more memory without altering the physical configuration of the motherboard 924.

The double module system 900 can increase system performance by separating the heat profile of the double module system 900 from the motherboard 924. The additional physical distance provided by the module adapter 914 can reduce the thermal impact on the motherboard 924.

The double module system 900 adds additional flexibility of the computer's memory subsystem by providing hybrid functionality in a memory package. The memory modules 902 of the double module system 900 may be different from one another to provide varying functionality.

For example, the double module system 900 can combine different configurations of the memory modules 902. The memory modules 902 can combine different module sizes, technologies, speeds, capacities, and functions. The memory modules 902 can include different pin configurations and still provide a single interface to the host computer. The memory modules 902 can include different types of memory, such as dynamic random access memory and Flash memory in a single unit.

The module connectors 908 may be used to connect to different types of modules other than just the memory modules 902. For example, the module connectors 908 can be used to mount backup power boards, cooling elements, non-volatile memory units, or other similar types of devices. The module adapter 914 can include an onboard power source to provide failure resistance to power interruptions.

2.10. Multiple Module System

Referring now to FIG. 10, therein is shown an example of a multiple module system 1000 in an embodiment. The multiple module system 1000 integrates multiple electronic modules 1002 on a module adapter 1014 installed in a memory channel connector 1022 on a motherboard 1024. The multiple module system 1000 may support hybrid configurations. The multiple module system 1000 is an embodiment of the memory module system.

The multiple module system 1000 comprises one or more electronic modules 1002 installed in module connectors 1008 attached to the module adapter 1014 which is attached to a computer system. The multiple module system 1000 can be installed into the memory channel connector 1022 of the motherboard 1024 and appear to the computer system to be a single, higher capacity memory module.

The electronic modules 1002, such as a first module 1004, a second module 1005, a third module 1006, and a fourth module 1007 can be any type of electronic module. For example, the electronic modules 1002 can be volatile memory modules, non-volatile memory modules, DRAM modules, Flash modules, power modules, control modules, hybrid modules, or similar functional modules thereof, as described elsewhere in the disclosure.

The module connectors 1008, such as a first connector 1010, a second connector 1011, a third connector 1012, or a fourth connector 1013 are structures to connect an electronic module to another system. The module connectors 1008 can be DIMM sockets connectors, SIMM socket connectors, or other types of connectors. Although the connectors are shown as mechanisms, it is understood that the electronic modules may be attached in other ways, such as by soldering. The connectors may have a variety of configurations to match the type of electronic module used.

The module adapter 1014 is a structure for coupling one or more of the electronic modules 1002 to the motherboard 1024. The module adapter 1014 can include an adapter board 1016 having an adapter control unit 1018 and an adapter connector 1020. For example, the module adapter 1014 can be configured as a printed circuit board (PCB) having the module connectors 1008 on one side and an adapter connector 1020 on the opposite side.

The adapter board 1016 is an electrical element for supporting and connecting other electronic elements. The adapter board 1016 can include electrical redistribution traces for conducting electrical signals to the electrical elements on the board. The electrical redistribution traces can transfer signals and power around the board including from a top side to a bottom side of the circuit board. The module connectors 1008 can be attached to the adapter board 1016 of the module adapter 1014 to allow the electronic modules 1002 to be mounted on the module adapter 1014. For example, the adapter board 1016 can be a transposer board with gold finger pins to connect to the memory channel connector 1020 of the motherboard 1024.

The adapter connector 1020 is an electrical element for connecting the adapter board 1016 to the memory channel connector 1022. The adapter connector 1020 can be a part of the adapter board 1016 or directly attached to the adapter board 1016.

The adapter connector 1020 may have a variety of configurations. For example, the adapter connector 1020 can be matched for the same configuration as the module connectors 1008. An another example, the adapter connector 1020 can be matched for any other type of the memory channel connector 1022 on the motherboard 1024.

Matching means that the adapter connector 1020 is configured to be connected to the memory channel connector 1020. For example, the adapter connector 1020 can be configured as the male portion to be inserted into the female receptacle of the memory channel connector 1022.

The module adapter 1014 includes the adapter control unit 1018 to provide the additional logic and electrical components to support the electronic modules 1002. For example, the adapter control unit 1018 can include the control logic to manage the module rank addressing for the electronic modules 1002. In another example, the adapter control unit 1018 includes the control logic to backup up a dynamic random access memory module to a Flash memory module when a power failure is detected. In yet another example, the adapter control unit 1018 can include power management control logic to control the power to the electronic modules 1002 in the event of a loss of power.

The adapter control unit 1018 can configure the module adapter 1014 to be electrically isolated from the memory channel connector 1022. The memory module system 1000 can then operate in isolation from any external system. For example, the adapter control unit 118 can detect a loss of power indicator from the external system and electrically isolate the module adapter 1014 from the memory channel connector 1022. The adapter control unit 1018 can then perform a backup from a volatile memory module to a non-volatile memory module utilizing a power module to provide operating power during the backup.

In still another example, the control logic can be on one of the electronic modules 1002. This may allow, for instance, one of the electronic modules 1002 to control the functionality of the other modules attached to the module adapter 1014. In yet another example, the adapter control unit 1018 and the associated control logic may be completely on one of the electronic modules 1002, and the module adapter 1014 can be a passive device providing connectivity for the electronic modules 1002. The control logic of the adapter control unit 1018 on one of the electronic modules 1002 can control the operation of the other electronic modules connected to the module adapter 1014.

The module adapter 1014 is shown in a particular form factor, although it is understood that the module adapter 1014 can have a variety of form factors. For example, the module adapter 1014 can be oriented horizontally or vertically. The module adapter 1014 can be constructed from a variety of materials including resin, plastic, polyimide, fiberglass, ceramic, composites, or a combination thereof.

The module adapter 1014 may have a variety of electrical component configurations. For example, the module adapter 1014 may be attached to more than two of the electronic modules 1002. The module adapter 1014 can be a printed circuit board, flexible circuit boards, film support structures, electrical traces, metal traces, conductive traces, discrete components, integrated circuits, or a combination thereof.

The multiple module system 1000 can increase the amount of memory available to a computer system by allowing multiple memory modules to be connected to the memory channel connector 1022 of the motherboard 1024. The amount of memory available on the multiple module system 1000 can exceed the amount of memory available on individual memory modules and thus allow more memory without altering the physical configuration of the motherboard 1024.

The multiple module system 1000 can increase system performance by separating the heat profile of the multiple module system 1000 from the motherboard 1024. The additional physical distance provided by the module adapter 1014 can reduce the thermal impact on the motherboard 1024.

The multiple module system 1000 can add additional flexibility of the computer's memory subsystem by providing hybrid functionality in a memory package. The electronic modules 1002 of the multiple module system 1000 may be different from one another to provide varying functionality.

For example, the multiple module system 1000 can combine different configurations of the electronic modules 1002. The electronic modules 1002 can combine different module sizes, technologies, speeds, capacities, and functions. The electronic modules 1002 can have different pin configurations and still provide a single interface to the host computer. The electronic modules 1002 can include different types of memory, such as dynamic random access memory and Flash memory in a single unit.

The module connectors 1008 can be used to connect to different types of modules other than just the electronic modules 1002. For example, the module connectors 1008 can be used to mount backup power boards, cooling elements, non-volatile memory units, or other similar types of devices. The module adapter 1014 can include an onboard power source to provide failure resistance to power interruptions.

In an illustrative example, the first module 1004 and the second module 1005 can be DRAM memory modules, such as DIMM boards. The third module 1006 can be a Flash memory module having non-volatile memory to perform backups of the DRAM memory modules in case of a power failure. The fourth module 1007 can be a backup power module to provide power for the DRAM and backup modules if a power failure occurs. In another illustrative example, one of the electronic modules 1002 can be a cooling unit.

2.11. Miscellaneous

Systems 100-1000 illustrate only some of many possible arrangements of components configured to provide the functionality described herein. Other arrangements may include fewer, additional, or different components, and the division of work between the components may vary depending on the arrangement. For example, in some embodiments, the power management unit may be omitted, along with any other components relied upon exclusively by the omitted component(s). As another example, in an embodiment, system 100 may further include different numbers of the memory modules. It is understood that although the system 100 is shown with two of the memory modules 102, other configurations are possible. For example, the system 100 may include four, eight, or larger numbers of the memory modules 102.

3.0. Implementation Mechanism—Hardware Overview

Figure 11:
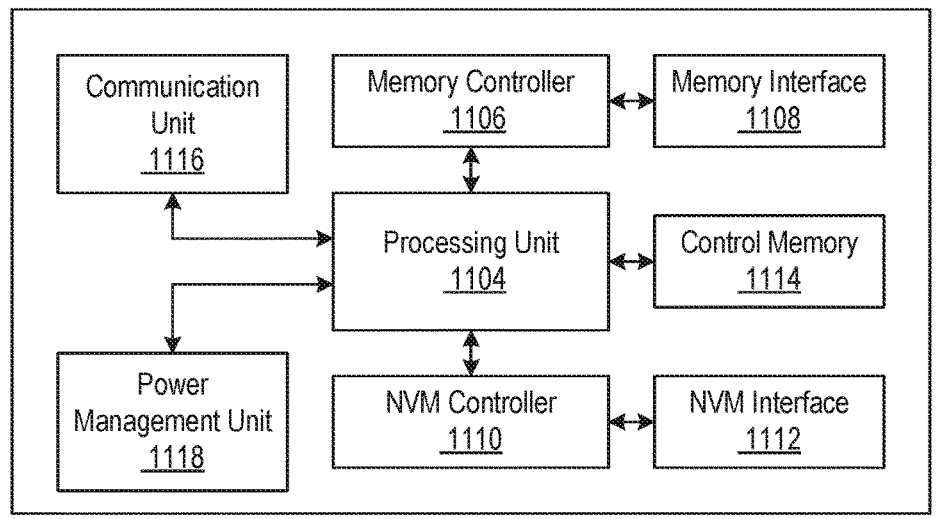
FIG. 11 shows an example of the adapter control unit.

Referring now to FIG. 11, therein is shown an example of the adapter control unit 1102. The adapter control unit 1102 can control the access between the memory modules 102 of FIG. 1 and the motherboard 124 of FIG. 1. The adapter control unit 1102 can control the inter-module communication between the memory modules 102.

The adapter control unit 1102 can include a processing unit 1104 for operating the adapter control unit 1102. The processing unit 1104 can execute software-based instructions in a control memory 1114 to perform the functions of the adapter control unit 1102. For example, the processing unit can be a microprocessor, a microcontroller, a finite state machine, or other computing components. The processor unit may alternatively or additionally execute hard-coded instructions in a Field Programmable Gate Array (FPGA), Application-Specific Integrated Circuit (ASIC), or other equivalent component.

The processing unit 1104 may be coupled to a memory controller 1106 for interfacing with the memory modules 102. The memory controller 1106 can be coupled to a memory interface 1108 having a direct connection with the memory modules 102. The memory controller 1106 may generate the commands to manage the memory modules 102. The memory interface 1108 can provide the electrical signals to control the memory modules 102.

In an illustrative example, the memory controller 1106 can receive a request to access (e.g. read or write) to an address location (e.g. in an address range that is above the valid address range of any single one of the memory modules 102) and translate the address location to an address on one of the memory modules 102. The memory controller 1106 can map the received address location to the address location on one of the memory modules 102, and trigger a module select line to access the selected one of the memory modules 102 is to be used for that particular memory access.

In an embodiment, the processing unit 1104 can be coupled to a non-volatile memory controller 1110 (NVM Controller) for interfacing with non-volatile memory devices, such as one of the memory modules 102 configured with Flash memory. The non-volatile memory controller 1110 can be coupled to a non-volatile memory interface 1112 (NVM Interface) having a direct connection with the non0volatile memory of the memory modules 102. The non-volatile memory controller 1110 and the non-volatile memory interface 1112 are optional components that are available when the memory module system 100 of FIG. 1 includes a non-volatile memory device.

The processing unit 1104 can be coupled to a communication unit 1116 for communicating with the motherboard 124 of FIG. 1. The communication unit 1116, such as a bus controller, a memory channel interface, or similar communication device, can transfer information, such as access requests and data, between the adapter control unit 1102 and the motherboard 124 via external communication channels.

The processing unit 1104 can be coupled to a power management unit 1118 for managing the power for the adapter control unit 1102 and the memory modules 102. For example, the power management unit 1118 can monitor the power delivered over the memory channel connector 122 of FIG. 1 and react to a power failure.

In an illustrative example, the power management unit 1118 can detect a power failure and signal the processing unit 1104 to initiate a backup of between the memory modules 102, where one of the modules is a volatile memory module and the other is a non-volatile memory module.

4.0. Functional Overview

In an embodiment, an adapter control unit or other component of a memory adapter, such as described in other sections, enhances the performance of a computing device's memory. The adapter is coupled to multiple memory modules, forming a memory module system that may be connected to and coupled to, for example a motherboard. The adapter may be configured to (e.g. via a control unit thereof) send signals to the motherboard that indicate to the motherboard that the adapter is collectively a single memory module. For example, during a power-up process, the adapter may identify the sizes of all of the memory modules attached to the adapter, and send one or more signals to the motherboard that indicate that the adapter is a single memory module consisting of a total amount of memory substantially equivalent to the sum of the sizes of the attached modules.

Thereafter, the adapter may receive requests to access addresses within the memory space of the total amount of memory reported by the adapter. The adapter may partition this total memory into subranges mapped to different attached memory modules. The adapter may determine, based on this mapping, local addresses within specific memory modules that are mapped to the requested adapter addresses. The adapter may thus translate the requests it receives into local requests, directed to individual modules, for access to local addresses, within the address spaces of the modules, that are mapped to the requested adapter addresses. The adapter may receive return data from the modules responsive to the local requests, and relay such data back to the requestor. In this manner, the motherboard need not be aware of the existence of multiple memory modules attached to the adapter, and may access the memory stored therein transparently as if a single cohesive memory module with a single memory space.

In an embodiment, such a memory module system provides, among other aspects, enhanced memory capacity and increased functionality by increasing the number of available memory slots in the host computer. In addition, the module adapter provides additional intelligence to support enhanced memory operations within the memory module system. The enhanced operations may be provided by the combination of action between the memory modules and the adapter control unit of the memory module system.

In an embodiment, increasing memory capacity is greatly simplified using the memory module system to add additional memory modules to the host computer. By providing additional connectivity for more of the memory modules, the total memory capacity of the host computer can be increased.

In another embodiment, the memory capacity and thermal performance are improved by mounting the memory modules in a horizontal configuration using the stacking connector. Because of the serial nature of the stacking connector, multiple memory modules can be added to the memory module system to increase capacity. Positioning the additional memory modules offset from the motherboard by module adapter improves the thermal performance of the system.

In an embodiment, the capacity and thermal performance are improved by mounting two of the memory modules in a vertical configuration on the module adapter. This configuration can double the amount of available memory and reduce the thermal performance of the system.

In an embodiment, the capacity and thermal performance are improved by mounting two of the memory modules in an angled configuration on the module adapter. This configuration can increase the amount of available memory and reduce the thermal performance of the system.

In yet another embodiment, memory integrity is improved by implemented a memory backup system by installed a DRAM memory module and a Flash memory module in the module adapter. The adapter control unit can detect a power failure and initiate a backup operation to transfer the active memory in the DRAM memory module to the Flash memory module.

4.1. Manufacturing Flow

Figure 12:
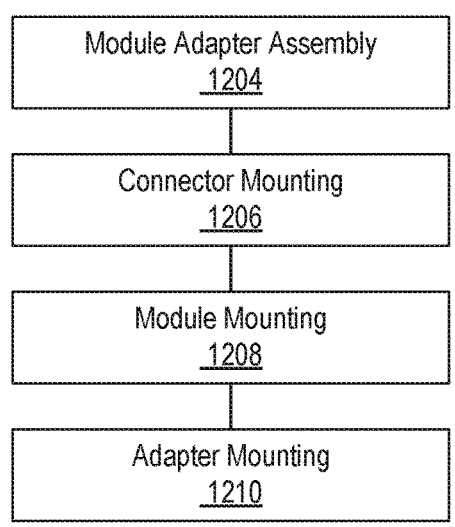
FIG. 12 shows an example of a manufacturing flow of the memory module system.

Referring now to FIG. 12, therein is shown an example of a manufacturing flow 1202 of the memory module system 100 of FIG. 1. The manufacturing flow 1202 describes the some of the steps used in the manufacture of a memory module system, such as memory module system 100, configured to operate as described herein.

The memory module system can be manufactured in a variety of ways. For example, flow 1202 may include a module adapter assembly step 1204, a connector mounting step 1206, a module mounting step 1208, and an adapter mounting step 1210.

In the module adapter assembly step 1204, that module adapter 114 of FIG. 1 can be formed by assembling the adapter board 116 of FIG. 1 and the adapter connector 120 of FIG. 1. The adapter board 116 of FIG. 1 can be formed having the adapter control unit 118 of FIG. 1. The adapter board 116 is an electrical element providing electrical interconnections between the on-board components. The adapter board 116 can provide electrical connectivity between the adapter control unit 118, the module connectors 108 of FIG. 1, and the adapter connector 120.

The adapter board 116 may be attached to a bottom side of the adapter connector 120. The adapter connector 120 is a connection element to allow the module adapter 114 to connect to the memory channel connector 122 of FIG. 1 of the motherboard 124 of FIG. 1.

In the connector mounting step 1206, the module connectors 108 of FIG. 1, such as the first connector 110 of FIG. 1 and the second connector 112 of FIG. 1, can be mounted on an upper surface of the adapter board 116. The module connectors 108 provide electrical connectivity between the memory modules 102 of FIG. 1 and the module adapter 114.

The module connectors 108 can be memory sockets, zero insertion force sockets, solder connections, or a combination thereof.

In the module mounting step 1208, the memory modules 102 may be mounted in the module connectors 108. The memory modules 102 can be any type of modules including volatile memory modules, non-volatile memory modules, DRAM memory modules, Flash memory modules, power modules, control modules, or a combination thereof, as described elsewhere in the disclosure.

In an adapter mounting step 1210, the module adapter 114 may be mounted on the motherboard 124 of a host computer. The adapter connector 120 of the module adapter 114 can be inserted into the memory channel connector 122 of the motherboard 124. The adapter connector 120 is configured to be compatible with the memory channel connector 122 and have the same pinout configuration as the memory channel connector 122.

4.2. Operation Flow

Figure 13:
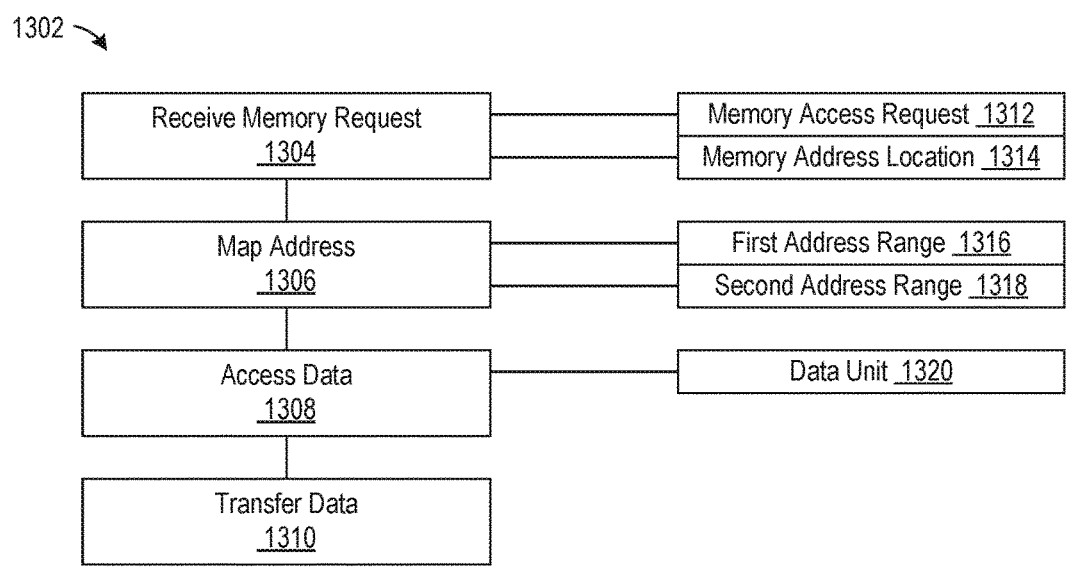
FIG. 13 shows an example of an operation flow of the memory module system.

Referring now to FIG. 13, therein is shown an example of an operation flow 1302 of the memory module system 100 of FIG. 1 according to an embodiment. The operation flow 1302 describes some of the steps used in the operation of the memory module system, such as the memory module system 100, configured to operate as described herein.

The memory module system 100 can be operated in a variety of ways. For example, the operation flow 1302 may perform steps including a receive memory request step 1304, a map address step 1306, an access data step 1308, and a transfer data step 1310.

In the receive memory request step 1304, the memory module system 100 installed in the memory channel connector 122 of FIG. 1 of the motherboard 124 of FIG. 1 can receive a memory access request 1312. The memory access request 1312 is a request to read or write data at a memory address location 1314. The data being read or written can include a data unit 1320 such as a data word, data byte, double byte, quadword, bit, or another data element. The memory access request 1312 can come from the host computer having the motherboard 124.

The memory access request 1312 can be within or outside a first address range 1316 of one of the memory modules 102 of FIG. 1. The first address range 1316 is the range of memory addresses available within one of the memory modules 102, such as the first memory module 104 of FIG. 1. For example, the memory access request 1312 outside the first address range 1316 can be above or below the first address range 1316. Outside can indicate that the memory access request 1312 may be above, below, not in an interleaved address range, or otherwise not available within the first address range 1316.

For example, the memory access request 1312 can include the memory address location 1314 that is above the first address range 1316 of the first memory module 104. Because the memory address location 1314 is above the first address range 1316, the memory module system 100 can redirect the memory access to a different one of the memory modules 102 to satisfy the request.

In the map address step 1306, the memory module system 100 can map the memory address location 1314 of the memory access request 1312 to a second address range 1318 of the second memory module 106 of FIG. 1. The adapter control unit 118 of FIG. 1 can receive the memory access request 1312 and determine how to redirect the memory access to one of the memory modules 102. The second address range 1318 is the range of memory addresses available within the second memory module 106 of FIG. 1.

The memory access may be performed in a variety of ways. For example, the adapter control unit 118 can use the processing unit 1104 of FIG. 11 to lookup the memory address location 1314 in a mapping table (not shown) stored in the control memory 1114 of FIG. 11. In another example, the processing unit 1104 can directly calculate the mapping of the memory address location 1314 based on the size and other configuration information about the memory modules 102.

In the access data step 1308, the memory module system 100 can access the data unit 1320 at the memory address location 1314. The processing unit 1104 can pass the memory address location 1314 to the memory controller 1106 of FIG. 11 which use the memory interface 1108 of FIG. 11 to access the data at the memory address location 1314. It is understood that the term access can indicate that the data is being read or written. The data unit 1320 is a unit of information stored in the memory module system 100 located at the memory address location 1314.

In the transfer data step 1310, the memory module system 100 can transfer the data through the adapter connector 120 of FIG. 1 of the module adapter 114 of FIG. 1. If the data is being written, then the data can be transferred from the host computer through the adapter connector 120 and into one of the memory modules 102. If the data is being read, then the data can be transferred from the memory modules 102 to the host computer through the adapter connector 120.

The various elements of the operation flow 1302 may be performed in a variety of systems, including systems such as system 100 described above. In an embodiment, each of the processes described in connection with the functional blocks described below may be implemented using one or more computer programs, other software elements, and/or digital logic in the adapter control unit 118 of FIG. 1, while performing data retrieval, transformation, and storage operations that involve interacting with and transforming the physical state of memory of the computer.

5.0. Example Embodiments

Examples of some embodiments are represented, without limitation, in the following clauses.

According to an embodiment, a method of manufacture of a memory module system comprises forming a module adapter having an adapter control unit and an adapter connector for connecting to a memory channel connector, the adapter control unit configured to manage a memory request received through the adapter connector, mounting a first connector directly on and over the module adapter, the first connecter configured to receive a first memory module, and mounting a second connector over the module adapter, the second connector configured to receive a second memory module.

In an embodiment, the method further comprises mounting the second memory module above the first memory module.

In an embodiment, the method further comprises mounting a pass-through adapter between the first memory module and the second memory module.

In an embodiment, the method further comprises mounting another module adapter between the first memory module and the second memory module.

In an embodiment, the method further comprises mounting the first memory module in the first connector and the second memory module in the second connector.

In an embodiment, the method further comprises mounting the first memory module adjacent to the second memory module.

In an embodiment, the method further comprises a stacking connector for attaching to the module adapter.

According to an embodiment, a method of operation of a memory module system comprises: at a module adapter, receiving a memory access request specifying a memory address location outside of a first address range of a first memory module, mapping the memory address location of the memory access request to another memory address location of a second address range of a second memory module in an adapter control unit; accessing a data unit at the memory address location of the second memory module, and transferring the data unit at the memory address location through an adapter connector of the module adapter.

In an embodiment, the second memory module is a volatile memory module, a non-volatile memory module, a control module, or a power module.

In an embodiment, receiving the memory access request includes receiving the memory access request at the module adapter comprises connectors to a plurality of memory modules.

In an embodiment, transferring the data unit includes transferring the data unit to the adapter connector attached to a motherboard of a host computer.

In an embodiment, mapping the memory address location includes mapping the memory address location in the second memory module using a processing unit of the adapter control unit.

In an embodiment, transferring the data unit includes transferring the data unit through a memory controller of the adapter control unit.

In an embodiment, transferring the data unit include transferring the data unit through a pass-through adapter connected to the module adapter.

According to an embodiment, a memory module system comprises a module adapter having an adapter connector and an adapter control unit for managing a memory request received thought the adapter connector, a first connector mounted on and over the module adapter, and a second connector mounted over the module adapter.

In an embodiment, the second module is above the first memory module.

In an embodiment, the system further comprises a pass-through adapter between the first memory module and the second memory module.

In an embodiment, the system further comprises another module adapter between the first memory module and the second memory module.

In an embodiment, the first memory module is mounted in the first connector and the second memory module is mounted in the second connector.

In an embodiment, the first memory module is mounted adjacent to the second memory module.

Other examples of these and other embodiments are found throughout this disclosure.

6.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method of manufacture of a memory module system comprising:

forming a module adapter having an adapter board with an adapter control unit and an adapter connector for connecting to a memory channel connector, the adapter control unit configured to manage a memory request received through the adapter connector;

mounting a first connector, among a plurality of connectors, directly on and over the module adapter, the first connecter configured to receive one of: a first memory module or a second memory module;

mounting a second connector, among the plurality of connectors, over the module adapter, the second connector configured to receive one of: the first memory module or the second memory module;

mounting a third connector, among the plurality of connectors, over the module adapter, wherein the first connector, the second connector, and the third connector each receive a different one of the first memory module, the second memory module, and a removable power module; and wherein the adapter control unit is configured to, upon detecting a loss of power, electrically isolate the module adapter from the memory channel connector, power the module adapter using the removable power module, and copy at least some of the contents of the first memory module to the second memory module.

2. The method as claimed in claim 1 further comprising mounting the second memory module above the first memory module.

3. The method as claimed in claim 1 further comprising mounting a pass-through adapter between the first memory module and the second memory module.

4. The method as claimed in claim 1 further comprising mounting another module adapter between the first memory module and the second memory module.

5. The method as claimed in claim 1 wherein the first memory module is a volatile memory module and the second memory module is a non-volatile memory module.

6. The method as claimed in claim 1 further comprising mounting the first memory module adjacent to the second memory module.

7. The method as claimed in claim 1 wherein the first memory module includes a stacking connector for attaching to the module adapter.

8. A method of operation of a module adapter comprising:
configuring a module adapter having an adapter board with an adapter control unit and an adapter connector to connect to a memory channel connector, the adapter control unit configured to manage a memory request received through the adapter connector
configuring a first connector, among a plurality of connectors, to accept a first memory module, the first connector further configured to receive the removable power module, and the first connector on the adapter board of the module adapter;
configuring a second connector, among the plurality of connectors, to accept a second memory module, the second connector further configured to receive the removable power module, and the second connector on the adapter board;
configuring a third connector, among the plurality of connectors, to accept a removable power module, the third connector on the adapter board, and wherein the first connector, the second connector, and the third connector each receive a different one of the first memory module, the second memory module, and the removable power module;
detecting a loss of power at an adapter control unit of the module adapter,
electrically isolating the module adapter from the memory channel connector and powering the module adapter using the removable power module; and
copying at least some of the contents of the first memory module attached to the module adapter to the second memory module attached to the module adapter.

9. The method as claimed in claim 8 wherein configuring the second connector includes positioning the second memory module over the first memory module.

10. The method as claimed in claim 8 wherein copying the contents of first memory module includes copying some of the contents of the first memory module through a passthrough adapter between the first memory module and the second memory module.

11. The method as claimed in claim 8 further comprising mounting a pass-through adapter between the first memory module and the second memory module.

12. The method as claimed in claim 8 wherein copying the contents of the first memory module includes copying some of the contents the first memory module using a processing unit of the adapter control unit.

13. The method as claimed in claim 8 wherein mounting the first memory module includes mounting the first memory module adjacent to the second memory module.

14. The method as claimed in claim 8 wherein mounting first memory module includes mounting a volatile memory module in the first connector and mounting a non-volatile memory module in the second connector.

15. A memory module system comprising:
a module adapter having an adapter board with an adapter connector and an adapter control unit, the adapter control unit configured to manage a memory request received through the adapter connector;
a first connector, among a plurality of connectors, mounted on and over the module adapter, a first memory module attached to the first connector, and the first connector configured to receive a removable power module; and
a second connector, among the plurality of connectors, mounted over the module adapter, a second memory module attached to the second connector, the second connector configured to receive the removable power module;
a third connector, among the plurality of connectors, mounted over the module adapter, the first connector, the second connector, and the third connector each configured to receive a different one of: the first memory module, the second memory module, and the removable power module and wherein the adapter control unit is configured to, upon detecting a loss of power, electrically isolate the module adapter from the memory channel connector and copy at least some of the contents of the first memory module to the second memory module.

16. The system as claimed in claim 15 wherein the second module is above the first memory module.

17. The system as claimed in claim 15 further comprising a pass-through adapter between the first memory module and the second memory module.

18. The system as claimed in claim 15 further comprising another module adapter between the first memory module and the second memory module.

19. The system as claimed in claim 15 wherein the first memory module is a volatile memory module and the second memory module is a non-volatile memory module.

20. The system as claimed in claim 15 wherein the first memory module is mounted adjacent to the second memory module.

* * * * *